United States Patent [19]

Dyson

[11] Patent Number: 4,801,802
[45] Date of Patent: Jan. 31, 1989

[54] IMAGING, DEVICE, ELEMENTS AND SYSTEMS

[75] Inventor: Clive M. Dyson, Southampton, England

[73] Assignees: Philips Electronic; Associated Industries Limited, both of London, England

[21] Appl. No.: 153,923

[22] Filed: Apr. 30, 1980

[30] Foreign Application Priority Data

May 25, 1979 [GB] United Kingdom ............ 7918368

[51] Int. Cl.[4] .................... G02F 1/01; H01L 25/00
[52] U.S. Cl. ............................. 250/330; 250/332; 250/370.01; 357/30
[58] Field of Search .............. 357/30, 30 H, 30 R; 250/330, 332, 334, 338, 370

[56] References Cited

U.S. PATENT DOCUMENTS

4,062,107 12/1977 Blackman et al. ............. 250/332

FOREIGN PATENT DOCUMENTS

1488258 of 1977 United Kingdom .

Primary Examiner—Stephen C. Buczinski
Attorney, Agent, or Firm—Cushman, Darby & Cushman

[57] ABSTRACT

Thermal-radiation imaging devices, elements and systems are described. The device comprises on a substrate (2) e.g. of sapphire semiconductor bodies or body portions in the form of parallel elongate strips (1), e.g. of cadmium mercury telluride. Biasing-electrode means (6 and 7) e.g. of gold are spaced on the strips (1) for causing a bias current predominantly of majority charge carriers to flow along each strip (1). The bias current supports an ambipolar drift of radiation-generated free minority carriers in the opposite direction. At the area of read-out means (8) in the drift path each strip (1) branches into two parts separated by a slot (13) parallel to the strip (1). One part (11 in FIG. 2) provides the continuation of the drift path, while a read-out connection comprises the other part (12 in FIG. 2) and is separated by the slot (13) from the adjacent biasing-electrode means (6 or 7). Metal layers (6, 7, 8) providing the biasing-electrode and read-out connections may extend onto the substrate (2) over a more rounded edge at the ends of each strip (1).

18 Claims, 3 Drawing Sheets

IMAGING, DEVICE, ELEMENTS AND SYSTEMS

The invention relates to thermal-radiation imaging devices comprising on a substrate a plurality of semiconductor bodies or body portions in the form of substantially parallel elongate strips and involving an ambipolar drift of radiation-generated free minority charge carriers along the strips. The invention further relates to elements for such devices and to thermal-radiation imaging systems comprising such a device or element.

British Patent Specification (GB) No. 1,488,258 discloses a thermal-radiation imaging device comprising a semiconductor body in the form of an elongate strip of semiconductor material in which free charge carriers can be generated on absorption of thermal radiation incident on said strip; biasing-electrode means are spaced in a direction along said strip for causing a bias current predominantly of majority charge carriers to flow along said strip, said bias current being capable of supporting an ambipolar drift of radiation-generated free minority charge carriers in the opposite direction to said bias current; and read-out means are present in the ambipolar drift path between the spaced biasing-electrode means.

The semiconductor material of the strip is usually cadmium mercury telluride. The read-out means may comprise, in close proximity, first and second read-out electrodes forming ohmic contacts to said strip; these electrodes which may be of a metal such as aluminum preferably extend across the strip, and one of these two electrodes may be common with a biasing electrode. The voltage developed between the two read-out electrodes in use of the device is a measure of the density of minority carriers generated by the radiation. However, in another form, the read-out means may be either metal or a semiconductor region (preferably extending across the strip) which forms a diode junction with the strip, and this junction is reverse-biased in use by applying a suitable bias voltage. The current generated via this diode is also a measure of the density of minority carriers generated by the radiation. The diode junctions may also be used in a non-biased condition.

In the particular forms of this device which are described and shown in said British Patent Specification No. 1,488,258, the metal or semiconductor region providing the read-out means is mounted on (and confined to) the semiconductor strip; the strip itself is mounted in a conventional encapsulation arrangement for cooling the strip to the desired operating temperature and for providing the appropriate electrical connections. It is conventional practice to use wire bonds to provide the electrical connections to a thermal-radiation imaging device in such an encapsulation. However the bonding of a wire connection directly to such a read-out means on the device strip can cause problems. The area of the read-out means is a sensitive area in the ambipolar drift path. Wire-bonding in this area can introduce damage into the semiconductor material, causing significant recombination of the charge carriers in this area. In extreme cases fracturing of the semiconductor material may even occur.

Furthermore in experiments which led to the present invention, the Applicants assembled a plurality of such device strips in parallel on a common substrate to form a two-dimensional sensing area. In order to reduce the non-sensitive area between the parallel strips it is desirable for the strips to be closely spaced together. In order to simplify the imaging system using such parallel strips it is also usually desirable for the said read-out means and biasing electrode means to be respectively substantially aligned in directions substantially perpendicular to the strips. This double desire for close spacing and alignment can be met by wire-bonding directly to the read-out means on each strip, but this suffers from the disadvantages described hereinbefore.

According to one aspect of the present invention there is provided a thermal-radiation imaging device comprising on a substrate a plurality of semiconductor bodies or body portions in the form of substantially parallel elongate strips of semiconductor material in which free charge carriers can be generated on absorption of thermal radiation incident on said strip, biasing-electrode means spaced in a direction along each of said strips for causing a bias current predominantly of majority charge carriers to flow along said strip, said bias current being capable of supporting an ambipolar drift of radiation-generated free minority charge carriers in the opposite direction to said bias current, and read-out means in the ambipolar drift path between the spaced biasing-electrode means, at the area of which read-out means each of said strips branches into two parts separated from each other by a slot which extends from said area in a direction substantially parallel to said strip, one of the two parts providing the continuation of the ambipolar drift path from said area to one of said biasing-electrode means, and a connection to said read-out means, which connection comprises the other of said two parts, extends from said area in a direction substantially parallel to said slot, and is separated by said slot from the said one of said biasing-electrode means.

In such a device the connections to said read-out means comprise said other parts of said strips and extend away from the area of said read-out means, so that if for example wire bonds are used in an encapsulation of the device these wires can be bonded to a part of the connection remote from the sensitive area associated with the read-out means. The parallel arrangement of the slot and the branch part of the said strip can permit this form of connection to the read-out means to extend between the semiconductor strips even in a closely-spaced and aligned arrangement of these strips. Thus, the arrangement of strips may be such that said biasing-electrode means and said read-out means of the strips are respectively substantially aligned in directions substantially perpendicular to said strips, and the strips may be so closely spaced that they are separated from each other on the substrate by slots having a width less than the width of one strip, for example less than half or even a quarter of the width of one strip.

The geometry of the multi-strip device can be particularly compact when the strip part which provides said continuation of the ambipolar drift path is narrower than the part of said drift path before said area of said read-out means. This narrowing of the ambipolar drift path at said area of said read-out means results in a constriction of the bias current in this area and so introduces a higher electric field which improves the device characteristics by increasing both the drift velocity and the responsivity of the device.

In order to isolate the semiconductor strips from the effect of electrical connections provided in the encapsulation arrangement, it is preferable to make these connections directly to metallization on the substrate rather than making them on part of the semiconductor body. In a particularly advantageous form each of the device strips has an upper edge which is more rounded at at least one end of said strip than it is along the sides of said strip, and metal layers forming connections to said biasing-electrode means and to said read-out means extend over this more rounded edge and onto said substrate. By so having a less rounded edge along the sides of said strips, the strips can be closely spaced in a compact geometry while the more rounded edge at the end of the strips can reduce problems in depositing a metal layer over this edge to form an unbroken and reliable connection to the read-out means and biasing-electrode means.

The read-out means may be of known type, for example involving ohmic contacts or diode junctions as hereinbefore described. In order to reduce the series resistance in the read-out connection, said other of the two parts preferably supports a metal stripe which extends to at least substantially the inner edge of said slot between said two parts to provide at least the main conductive path of said connection comprising said part.

According to another aspect of the invention an element for a thermal-radiation imaging device comprising a semiconductor body in the form of at least one elongate strip of semiconductor material in which free charge carriers can be generated on absorption of thermal radiation incident on said strip, biasing-electrode means spaced in a direction along said strip for causing a bias current predominantly of majority charge carriers to flow along said strip, said bias current being capable of supporting an ambipolar drift of radiation-generated free minority charge carriers in the opposite direction to said bias current, and read-out means in the ambipolar drift path between the spaced biasing-electrode means, is characterised in that at the area of the read-out means said strip branches into two parts separated from each other by a slot which extends from said area in a direction substantially parallel to said strip, in that one of the two parts provides the continuation of the ambipolar drift path from said are to one of said biasing-electrode means, and in that a connection to said read-out means comprises the other of said two parts, extends from said area in a direction substantially parallel to said slot, and is separated by said slot from the said one of said biasing-electrode means.

Such devices and elements in accordance with the invention may be used in a system involving mechanical scanning means such as is described in said British Patent Specification (GB) No. 1,488,258. Thus, according to a further aspect of the invention there is provided a thermal-radiation imaging system comprising a device or element in accordance with the present invention, and means for scanning a thermal radiation image along said strip(s) in the same direction as the ambipolar drift and at a rate corresponding substantially to the ambipolar drift velocity.

However, devices and elements in accordance with the invention may be used in thermal-radiation imaging systems using other forms of scanning, for example a system comprising means for applying a scanning voltage gradient to the strip(s) via the biasing-electrode means so as to drive the radiation-generated carriers towards said read-out means.

Embodiments of the various aspects of the invention will now be described by way of example with reference to the accompanying diagrammatic drawings which also illustrate yet further advantageous features which can be obtained in accordance with the invention. In these drawings.

It should be noted that the Figures are not drawn to scale, and the relative dimensions and proportions of some parts have been exaggerated or reduced for the sake of clarity and convenience. The same reference numerals are used in the different Figures to indicate not only the same portions of the same device or element but also similar portions of different devices and elements.

Figure 1:
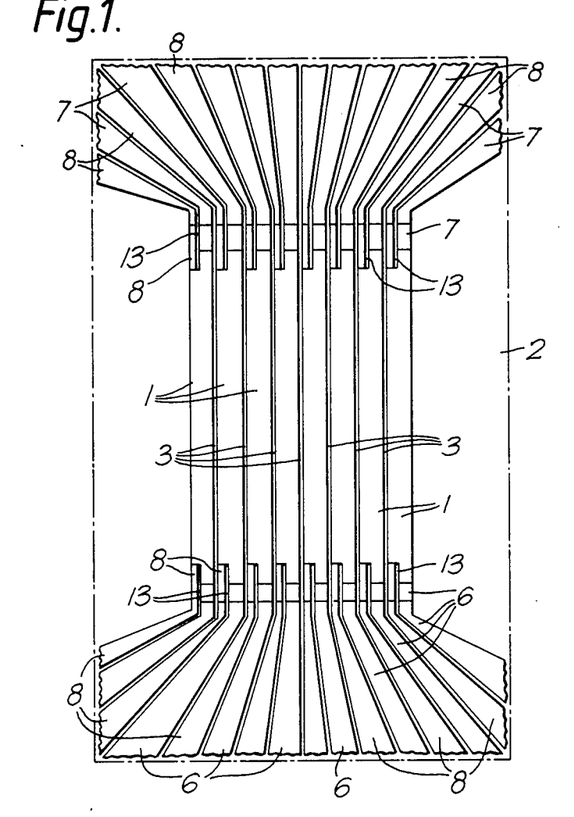
FIG. 1 is a plan view of a thermal-radiation imaging device in accordance with the invention.
Figure 2:
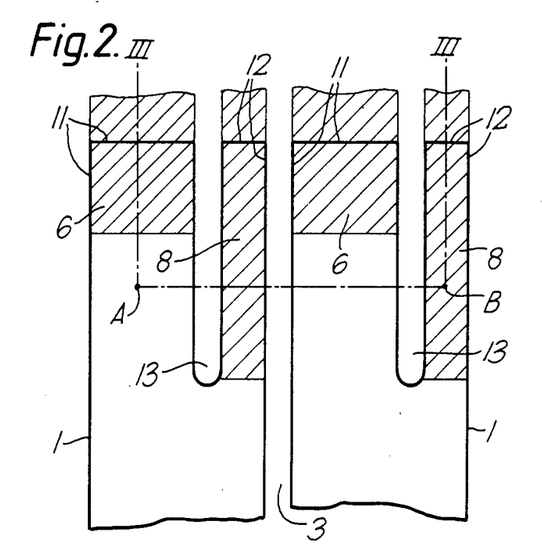
FIG. 2 is an enlarged plan view of part of the device of FIG. 1 showing end portions of two of its elements in accordance with the invention.
Figure 3:
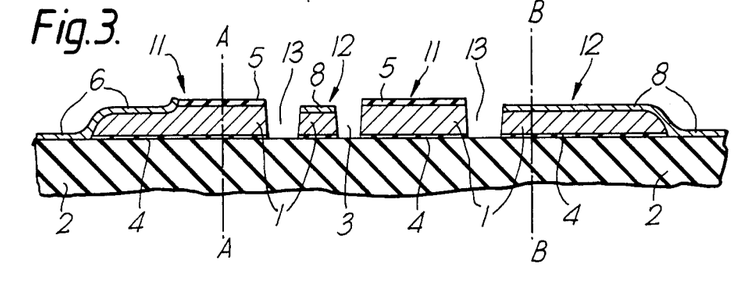
FIG. 3 is a cross-section on the line III—III in FIG. 2.

The thermal-radiation imaging device of FIGS. 1 to 3 comprises a plurality of photoconductive elements 1 on a substrate 2. The elements 1 are semiconductor bodies in the form of substantially parallel elongate rectangular strips of semiconductor material of a given conductivity type in which free charge carriers can be generated on absorption of thermal radiation incident on said strip. The semiconductor material may be, for example, n-type cadmium mercury telluride $Hg_{0.79}Cd_{0.21}Te$ having a carrier concentration of less than $5 \times 10^{14} cm^{-3}$ in the absence of incident radiation. In material of this composition the radiation absorption edge at an operating temperature of 77° K. is at a wavelength of approximately 11.5 microns. In this material the absorption of infra-red radiation in the 8 to 14 micron window is effective in generating electron-hole pairs, the mobility of the holes at the intended temperature of operation of 77° K. being 600 $cm^2 V^{-1} sec^{-1}$ and the lifetime being 2.5 microseconds. The electron mobility is approximately $2.10^5 cm^2 V^{-1} sec^{-1}$.

Each strip 1 may have a length of for example 1 m.m., a width of 62.5 microns and a thickness of 10 microns. The strips 1 may be separated by slots 3 having a width of for example 12.5 microns. FIG. 1 shows by way of example eight such separated strips 1. It will be evident that different systems may require a different number of strips and different dimensions for their length, width, thickness and spacing.

The substrate 2 may be of sapphire and the semiconductor strips 1 may be secured to the substrate by a layer of epoxy adhesive which may be for example 0.5 micron thick, see FIG. 3. On the upper surface of each semiconductor strip 1 there is a passivating layer 5 which may be of approximately 0.1 micron thickness and consisting mainly of oxides of mercury, cadmium and tellurium.

The passivating layer 5 has been removed from both opposite ends of the upper surface of each strip 1 where biasing electrodes 6 and 7 are present. These electrodes may consist of deposited layers of gold of approximately 1 micron thickness each forming ohmic contact with the semiconductor surface. They may extend on the semiconductor surface over a distance of for example 100 microns from the ends of the strips 1. As illustrated in FIG. 3, the electrodes 6 and 7 may be sunk over a short distance in the semiconductor surface, for example 1 or 2 microns, and they may be formed using the ion-etching and metal lift-off technique described and claimed in our published British Patent Application (GB) No. 2027986 A (Our reference PHB 32631).

The metal layers forming the electrodes 6 and 7 also extend on the substrate 2 where they serve as connections to the electrodes. The electrode connections 6 and 7 on the substrate slightly expand and diverge to form areas where for example gold wire connections may be made when the device is mounted in a housing. As illustrated in FIG. 3, the upper edge of each of the strips 1 is more rounded at the opposite ends of the strip than it is along the sides of the strip. The metal layers forming the electrode connections 6 and 7 extend onto the substrate 2 over this more rounded edge. Ion-etching may be used to form the parallel semiconductor strips 1 from a single semiconductor body and to form the separate electrodes and their connections for each strip 1 from a metal layer deposited on the semiconductor body and on the substrate 2. The method described in our published British Patent Application (GB) No. 2027556 A (Our reference PHB 32630) may be used.

By applying a D.C. bias voltage between these electrodes 6 and 7 spaced along each of the strips 1 a bias current predominantly of majority charge carriers (electrons, in this example) is caused to flow in a direction along the strip. This bias current is capable of supporting an ambipolar drift of radiation-generated free minority carriers (holes, in this example) in the opposite direction. The operation of the device will be described more fully later with reference to FIG. 5.

Read-out means comprising an electrode 8 are present in the ambipolar drift path between the spaced biasing electrodes 6 and 7. These read-out means may be of any of the known types. They may be a surface-adjoining region of opposite conductivity type (p-type in this example) which forms a p-n diode junction with the bulk of the semiconductor strip 1. It should be noted this region and the bulk of the semiconductor strip 1 exhibit these conductivity type properties at the intended temperature of operation of the device but do not necessarily exhibit these properties at room temperature. In the particular case when n-type cadmium mercury telluride is used for the strips 1 and where the intended operating temperature is 77° K. the presence of such a p-n diode junction may not be apparent at room temperature. Instead of a p-n junction, the read-out means may comprise a Schottky (metal-semiconductor) diode junction.

However, in the example illustrated in FIGS. 1 to 3, the read-out means does not include a diode junction but merely comprises spaced electrodes (8 and 6) and (8 and 7) all of which form ohmic contacts with the semiconductor strips 1. The device of FIGS. 1 to 3 has read-out means at both ends of each strip 1. This permits read-out with the strips 1 biased in either direction, i.e. either read-out using electrodes (8 and 6) with the bias current from electrode 6 to electrode 7 or read-out using electrodes (8 and 7) with the current from electrode 7 to electrode 6. Therefore if the characteristics of the device as made are better when biased in one direction rather than the other, this one direction can be chosen for operation.

Figure 4:
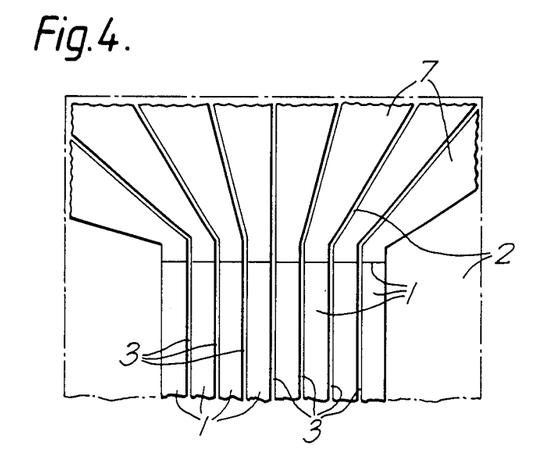
FIG. 4 is a plan view of part of a thermal-radiation imaging device in accordance with the invention and having a modified end portion of its elements.
Figure 5:
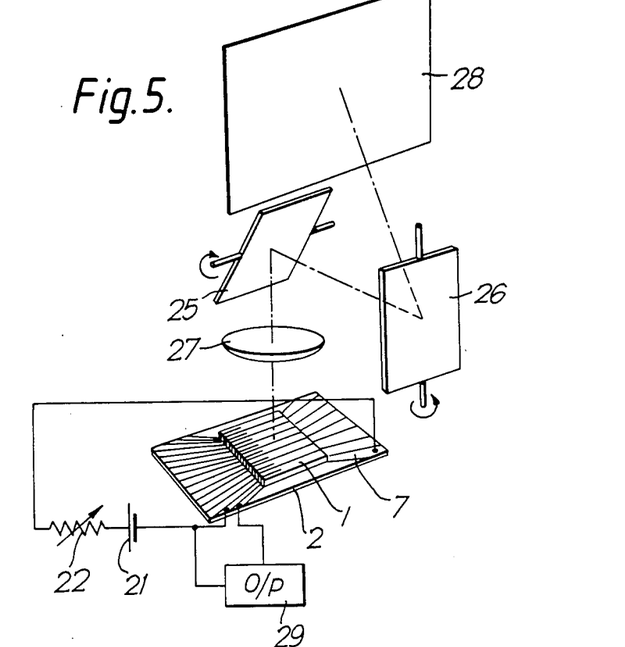
FIG. 5 is a perspective view, in simplified form, of parts of a thermal-radiation imaging system in accordance with the invention.

However, it is not necessary to have read-out means at both ends of the strips 1. Thus, for example both FIGS. 4 and 5 illustrate arrangements in which no read-out means is provided adjacent the electrode 7 end of the strips 1. In both the FIGS. 4 and 5 arrangements, the metal layer which provides the separate electrodes 7 of each strip 1 extends over the end of each strip 1 and onto the substrate 2. It is also possible to provide read-out electrodes at spaced intervals along the ambipolar drift path of each strip 1 so as to produce in each strip 1 a plurality of elements which are used sequentially.

The length of the ambipolar drift path in front of the relevant read-out means and over which total integration of the radiation-generated minority carriers can be effected is limited to a distance determined by the lifetime of minority carriers in the semiconductor material, the electric field, and the ambipolar mobility which pertains to the semiconductor material and which usually approximates to the minority carrier mobility. This distance therefore has to be taken into account in the positioning of the read-out means along the strips 1.

In accordance with the present invention, at the area of the read-out means (8 and 6) and (8 and 7) each of the strips 1 branches into two parts 11 and 12 (see FIGS. 2 and 3) separated from each other by a slot 13 which extends from that area in a direction substantially parallel to the strip 1.

One part 11 provides the continuation of the ambipolar drift path from that area to the adjacent biasing electrode 6 or 7.

The electrode 8 extends from the read-out area in a direction substantially parallel to the slot 13 to form a metal stripe connection of the read-out electrode 8 which is supported by the other part 12. This connection comprises the part 12 at least as a mechanical support for the metal stripe. This electrode connection is separated by the slot 13 from the adjacent biasing electrode 6 or 7. This stripe connection 8 is sunk over a short distance in the semiconductor surface and also extends over the more rounded end edges of the strips 1 and onto the substrate 2 to form areas for wire connections. This metal stripe pattern may be formed simultaneously from the same metal layer as the electrodes 6 and 7, and the slots 13 may be formed simultaneously with the slots 3. The slots 13 may also each have a width of for example 12.5 microns.

Thus, a compact device geometry is obtained in which the biasing electrodes 6 and 7 and read-out electrodes 8 are respectively substantially aligned in directions substantially perpendicular to said strips 1.

Both the parts 1 and 12 are an elongation of their respective strip 1 beyond the area of the read-out means. Therefore the continuation of the ambipolar drift path in the part 11 is narrower than the main part of said drift path before the area of the read-out means. This gives rise to current constriction in the part 11 which as mentioned hereinbefore increases both the drift velocity and the responsivity of the device. However, the part 11 should not be too narrow, because its sides have a higher carrier recombination effect which will reduce the minority carrier lifetime in the part 11. Therefore preferably, the part 11 will be wider than the part 12 and will be at least half the width of the main part of the ambipolar drift path before this area. Thus, in the device of FIGS. 1 to 3 the parts 11 and 12 may be for example 35 microns wide and 15 microns wide respectively.

If the adjacent biasing electrode 6 or 7 is too close to the read-out electrode 8 it can reduce the responsivity and detectivity of the element. Therefore the continuation of the drift path in the part 11 is preferably longer than its width. In the arrangement illustrated in FIGS. 1 to 3, the distance between the biasing electrode 6 and the area where the read-out electrode 8 contacts the drift path may be for example 50 microns. In the particular form illustrated in FIGS. 1 and 2 the read-out electrode 8 does not extend beyond the inner end of the slot 13, and so contacts the drift path at one side; an advantage of this is that the lateral extent of the electrode stripe 8 is precisely determined by the parallel slots 13 and 3. However, other forms are possible in which the read-out electrode 8 extends beyond the inner end of the slot 13 to have a more extensive contact area with the drift path. Thus in the form illustrated in FIG. 6 the metal stripe 8 also extends right across the strip 1 so as to form the read-out electrode beyond the slot 13.

During operation the device is maintained at a cryogenic temperature and so is further mounted in accordance with the specific intended application. Such further mounting is not illustrated in the accompanying drawings but will normally consist of mounting the substrate 2 in an evacuated enclosure having a window for transmission of infra-red radiation (for example in the 8 to 14 micron band), the enclosure being provided with means for maintaining the substrate 2 with its semiconductor strips 1 at the required operating temperature (for example 77° K.). One such form of mounting consists of the Dewar-type encapsulation as commonly employed in the infra-red detector art.

The operation of such a device in accordance with the invention will now be described with reference to FIG. 5. Via its biasing electrodes 6 and 7 and wire connections, each strip 1 is connected in series with a D.C. bias source 21 and a variable resistor 22 to produce a constant bias current predominantly of majority charge carriers (in this case, electrons) flowing in the strips 1 in the longitudinal direction from the electrode 6 to the electrode 7. For the sake of clarity of drawing, the connections of the bias source 21 to all the electrodes 6 and 7 are not shown in FIG. 5 which only illustrates the connections of one of the strips 1.

The bias current is capable of supporting an ambipolar drift of radiation-generated free minority carriers (in this case, holes) in the opposite direction, i.e. in the direction from electrode 7 to electrode 6. A suitable range of bias voltage between the electrodes 6 and 7 is from 1 volt to 10 volts. At a potential drop of 15 volts per cm. in the n-type material of the said composition the ambipolar mobility is approximately 400 cm$^2$ V$^{-1}$ sec$^{-1}$.

The scanning of a radiation pattern and the focussing of an image of an elemental area of the pattern on the strips 1 may be effected in a similar manner to that described in said British Patent Specification No. 1,488,258. Such means for scanning a thermal radiation image along the strips 1 in the same direction as the ambipolar drift and at a rate corresponding substantially to the ambipolar drift velocity are illustrated in a simplified diagrammatic manner in FIG. 5. They may comprise a pair of rotatable mirrors 25 and 26 and a lens system 27. By these means, image areas of a ration pattern from a scene 28 are moved with a velocity in the range of 5,000 cm.sec$^{-1}$ to 20,000 cm.sec$^{-1}$ along the surface of one or more of the semiconductor strips 1.

Thus, as the image is scanned across the surface of the semiconductor strips 1 at a rate corresponding to the ambipolar drift velocity, integration of the radiation-generated minority carriers occurs in the part of the n-type strips 2 where the radiation is incident before they reach the read-out electrodes 8. Due to the passage of these integrated radiation-generated minority carriers through the strip part 11 between the electrodes 8 and 6, conductivity modulation occurs in this part 11. The picture signal is derived in known manner using an output circuit 29 which is connected between the electrodes 8 and 6 and which amplifies and processes the voltage change occurring between the electrodes 8 and 6 as a result of the conductivity modulation. For the sake of clarity in the drawing, only the output circuit 29 for one strip 1 has been shown, whereas in practice separate output circuits 29 are provided for each strip 1 and are connected between the electrodes 6 and 8 of their respective strip.

It will be evident that many modifications are possible within the scope of the present invention. Thus, for example the composition of the n-type cadmium mercury telluride may be chosen differently, for example to provide a device for imaging radiation in the 3 to 5 micron band. Semiconductor materials other than cadmium mercury telluride may be used to form the photoconductive strips 1.

In the embodiments described the metal stripe 8 extends over the whole upper surface of the part 12 to at least substantially the inner end of the slot 13. The metal stripe 8 therefore provides the main conductive path of the read-out connection comprising the part 12. In such a case it is not necessary that the part 12 forms a conductive part of the electrical connection so that it may be merely a mechanically supporting part of the connection. However, if the system in which the device is to be used can have a higher series resistance in the read-out connection, the metal stripe 8 need not extend as far as the inner end of the slot 13; it may extend on the part 12 only so far as for example the electrode 6 or 7 extends on the part 11 so that the part of the read-out connection between this shorter stripe 8 and the ambipolar drift path is provided solely by the conductive path in the semiconductor part 11.

Figure 6:
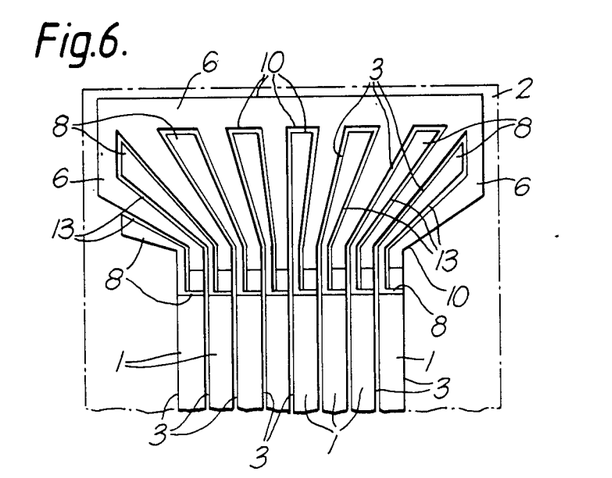
FIG. 6 is a plan view of part of a further thermal-radiation imaging device in accordance with the invention.

In the embodiments described the strips 1 are formed as discrete semiconductor bodies on an insulating substrate, for example of sapphire. FIG. 6 however illustrates another arrangement also in accordance with the invention, in which the strips 1 are portions of a common semiconductor body 10 and are integrally united via a common portion supporting the electrode 6. Neither of the electrodes 6 and 8 extend onto the substrate 2 which may be of sapphire as in the previous embodiments. However in a modified form also in accordance with the invention, the strips 1 of FIG. 6 may be formed from an epitaxial layer of one conductivity type material which is deposited on for example an intrinsic substrate 2 or a substrate 2 of cadmium telluride. In this form of FIG. 6 the epitaxial material is removed at grooves 3 and 13 to provide the element structure, and the biasing and read-out electrode metallization 6, 7 and 8 is confined to the remaining epitaxial layer portions; the grooves 3 and 13 merge together to isolate the adjacent electrodes 6 and 8, and wire connections are bonded to parts of the electrode pattern 6, 7 and 8 on the epitaxial layer remote from the active strip portions 1.

In order to remove any unwanted injected minority carriers (holes) from the ambipolar drift path adjacent the main biasing electrode which forms the anode there may be provided a rectifying junction with an electrode connection adjacent this biasing electrode in order to provide a drain for such minority carriers and thereby effectively isolate the first stage of the ambipolar drift path from this biasing electrode. This electrode connection for such a rectifying junction may be provided using a slot in a manner similar to that for the read-out means.

By widening the gaps 3 over most of their length, the strips 1 may be made narrower between the read-out means than they are adjacent the read-out means. However, such a configuration increases the non-sensitive, so-called "dead" space between the strips 1, and therefore it is generally not so desirable.

It is not necessary for the strips 1 to extend in substantially straight lines. Thus, each of the strips 1 may meander about an imaginary straight line, which lines of the different strips are substantially parallel to each other.

I claim:

1. A thermal-radiation imaging device comprising on a substrate a plurality of semiconductor bodies or body portions in the form of substantially parallel elongate strips of semiconductor material in which free charge carriers can be generated on absorption of thermal radiation incident on said strip, biasing-electrode means spaced in a direction along each of said strips for causing a bias current predominantly of majority charge carriers to flow along said strip, said bias current being capable of supporting an ambipolar drift of radiation-generated free minority charge carriers in the opposite direction to said bias current, and read-out means in the ambipolar drift path between the spaced biasing-electrode means, at the area of which read-out means each of said strips branches into two parts separated from each other by a slot which extends from said area in a direction substantially parallel to said strip, one of the two parts providing the continuation of the ambipolar drift path from said area to one of said biasing-electrode means, a connection to said read-out means, which connection comprises the other of said two parts, extends from said area in a direction substantially parallel to said slot, and is separated by said slot from the said one of said biasing-electrode means.

2. A device as claimed in claim 1, in which each of said strips has an upper edge which is more rounded at at least one end of said strip than it is along the sides of said strip, and metal layers forming connections to said biasing-electrode means and to said read-out means extend over this more rounded edge and onto said substrate.

3. A device as claimed in claim 1 or claim 2, in which said biasing-electrode means and said read-out means of the different strips are respectively substantially aligned in directions substantially perpendicular to said strips.

4. A device as claimed in claim 3, in which said substantially parallel elongate strips are separated from each other on the substrate by slots having a width less than half the width of one strip.

5. An element for a thermal-radiation imaging device comprising a semiconductor body in the form of at least one elongate strip of semiconductor material in which free charge carriers can be generated on absorption of thermal radiation incident on said strip, biasing-electrode means spaced in a direction along said strip for causing a bias current predominantly of majority charge carriers to flow along said strip, said bias current being capable of supporting an ambipolar drift of radiation-generated free minority charge carriers in the opposite direction to said bias current, and read-out means in the ambipolar drift path between the spaced biasing-electrode means, characterized in that at the area of the read-out means said strip branches into two parts separated from each other by a slot which extends from said area in a direction substantially parallel to said strip, in that one of the two parts provides the continuation of the ambipolar drift path from said area to one of said biasing-electrode means, and in that a connection to said read-out means comprises the other of said two parts, extends from said area in a direction substantially parallel to said slot to form a connection to said read-out means, and is separated by said slot from the said one of said biasing-electrode means.

6. An element as claimed in claim 5, in which the one of said two parts which provides said continuation of the ambipolar drift path is wider than the other of said two parts which is associated with said connection of the read-out means.

7. An element as claimed in claim 5, in which said continuation is narrower than the part of said ambipolar drift path before said area of said read-out means.

8. An element as claimed in claim 7, in which the said continuation of the ambipolar drift path after said area is at least half the width of said ambipolar drift path before said area.

9. An element as claimed in claim 5 or claim 7, in which said other of the two parts supports a metal stripe which extends to at least substantially the inner end of said slot between said two parts to provide at least the main conductive path of said connection of said read-out means.

10. An element as claimed in claim 9, in which said metal stripe extends beyond said inner end of said slot and across the strip to form a read-out electrode.

11. A device as claimed in claim 1 or claim 2, in which said other of the two parts supports a metal stripe which extends to at least substantially the inner end of said slot between said two parts to provide at least the main conductive path of said connection of said read-out means.

12. A device as claimed in claim 1, in which said continuation of the ambipolar drift path is narrower than the part of said ambipolar drift path before said area of said read-out means.

13. A thermal-radiation imaging device comprising
(a) a substrate,
(b) a plurality of semiconductor bodies or body portions in the form of substantially parallel elongate strips of semi-conductor material on said substrate, in which material free charge carriers can be generated on absorption of thermal radiation incident on said strips,
(c) biasing-electrode means spaced in a direction along each of said strips for causing a bias current predominantly of majority charge carriers to flow along said strip, said bias current being capable of supporting an ambipolar drift of radiation-generated free minority charge carriers in the opposite direction to said bias current,
(d) read-out means in the ambipolar drift path between the spaced biasing-electrode means, at the area of which read-out means each of said strips is shaped to have a part which is narrower than the width of the strip in front of said area and which provides in said area a continuation of the ambipolar drift path which is of reduced width and increased electric field compared with the ambipolar drift path before said area, and (e) a connection to said read-out means, which connection extends from said narrower part of the strip and is separated from said biasing-electrode means.

14. A device as claimed in claim 12 or claim 13, in whcih said biasing-electrode means and said read-out means of the different strips are respectively substantially aligned in directions substantially perpendicular to said strips.

15. A thermal-radiation imaging system comprising
    (a) a substrate,
    (b) a plurality of semiconductor bodies or body portions in the form of substantially parallel elongate strips of semi-conductor material on said substrate, in which material free charge carriers can be generated on absorption of thermal radiation incident on said strips,
    (c) biasing-electrode means spaced in a direction along each of said strips for causing a bias current predominantly of majority charge carriers to flow along said strip, said bias current being capable of supporting an ambipolar drift of radiation-generated free minority charge carriers in the opposite direction to said bias current,
    (d) read-out means in the ambipolar drift path between the spaced biasing-electrode means, at the area of which read-out means each of said strips branches into two parts separated from each other by a slot which extends at least in a direction substantially parallel to said strip, one of the two parts providing the continuation of the ambipolar drift path from said area to one of said biasing-electrode means,
    (e) a connection to said read-out means, which connection comprises the other of said two parts, extends from said area in a direction substantially parallel to said slot, and is separated by said slot from the said one of said biasing-electrode means, and
    (f) scanning means for scanning a thermal radiation image along said strips in the same direction as the ambipolar drift and at a rate corresponding substantially to the ambipolar drift velocity.

16. A system as claimed in claim 15, in which the said continuation of the ambipolar drift path is narrower than the part of said ambipolar drift path before said area of said read-out means.

17. A thermal-radiation imaging system comprising
    (a) a substrate,
    (b) a plurality of semiconductor bodies or body portions in the form of substantially parallel elongate strips of semi-conductor material on said substrate, in which material free charge carriers can be generated on absorption of thermal radiation incident on said strips,
    (c) biasing-electrode means spaced in a direction along each of said strips for causing a bias current predominantly of majority charge carriers to flow along said strip, said bias current being capable of supporting an ambipolar drift of radiation-generated free minority charge carriers in the opposite direction to said bias current,
    (d) read-out means in the ambipolar drift path between the spaced biasing-electrode means, at the area of which read-out means each of said strips is shaped to have a part which is narrower than the width of the strip in front of said area and which provides in said area a continuation of the ambipolar drift path which is of reduced width and increased electric field compared with the ambipolar drift path before said area,
    (e) a connection to said read-out means, which connection extends from said narrower part of the strip and is separated from said biasing-electrode means, and
    (f) scanning means for scannng a thermal radiation image along said strips in the same direction as the ambipolar drift and at a rate corresponding substantially to the ambipolar drift velocity.

18. A system as claimed in claim 15 or claim 17, in which said biasing-electrode means and said read-out means of the different strips are respectively substantially aligned in directions substantially perpendicular to said strips.

* * * * *

UNITED STATES PATENT AND TRADEMARK OFFICE
CERTIFICATE OF CORRECTION

PATENT NO. : 4,801,802
DATED : January 31, 1989
INVENTOR(S) : DYSON, Clive Malcolm It is certified that error appears in the above-identified patent and that said Letters Patent is hereby corrected as shown below:

In the title, after "IMAGING", delete the "," and change "device" to

--devices--.

In the identification of the Assignee after "Electronic" delete the ";"

and insert --and--, and delete "both".

IN THE SPECIFICATION:

Column 3, line 39, change "are" to --area--.

Column 5, line 68, change "arangements" to --arrangements--.

Column 6, line 48, change "1" to --11--.

Column 7, line 60, change "ration" to --radiation--.

Column 9, line 36, after the "," insert --and--.

Signed and Sealed this

Twenty-seventh Day of February, 1990

*Attest:*

JEFFREY M. SAMUELS

*Attesting Officer*     *Acting Commissioner of Patents and Trademarks*